Inventor
Albert E. Slade
by Roberts, Cushman & Grover
Attys

SUPERCONDUCTIVE CONTROL DEVICE

Filed March 15, 1957 2 Sheets-Sheet 2

Inventor
Albert E. Slade
by Roberts, Cushman & Grover
Attys 3,166,738

SUPERCONDUCTIVE CONTROL DEVICE

Albert E. Slade, Cochituate, Mass., assignor to Arthur D. Little, Inc., Cambridge, Mass., a corporation of Massachusetts Filed Mar. 15, 1957, Ser. No. 646,485
6 Claims. (Cl. 340—173.1)

This invention relates to a device for controlling electric current and more particularly to a device for quenching persistent current in a superconductive body.

Various superconductive materials are known which are capable of a change of state from one of finite electrical resistance to one of zero resistance. For example, a body of lead cooled to 7.2 degrees Kelvin suddenly drops to zero resistance. The temperature at which superconductive materials undergo such transition is dependent on the magnetic field about the material. The critical temperature of 7.2° K. for lead supposes a zero magnetic field. As the field increases toward approximately 800 oersteds the transition temperature drops toward zero, and at intermediate temperatures there is a critical field which, if exceeded, will cause the lead body to change from superconducting state to a state of finite resistance. Thus for any given temperature below critical temperature there is a predetermined critical or threshold value of magnetic field above which lead undergoes transition from the superconducting state, and the transition between superconduction and finite resistance can be effected by varying the magnetic field respectively below and above the predetermined value of magnetic field. Above the critical temperature no reduction of field can restore superconduction. Herein the term superconductive is used to designate the capability of the body to change between the above-mentioned states, while superconducting or superconduction designates the zero resistance state.

It has been demonstrated that a persistent current can be established in a closed loop of superconductive material while in superconducting state. Establishing persistent current is used to mean that electrical or magnetic energy, or both, are stored in the superconducting loop apparently in the form of a steady electrical current which establishes a commensurate fixed, magnetic field. Present physical measuring methods show no reduction of the apparent persistent current in a superconducting loop over a period of years, and indicate that the energy so stored is released when persistent current is quenched.

Persistent current may be established by applying to and removing from a superconductive loop a magnetic field increasing to a value in excess of critical value. When the field is reduced below critical value, and if the field is so oriented that its contracting lines of force are cut by the superconducting loop, persistent current will be established analogously to the induction of current in a conventional conductor in a changing field.

Persistent current may be quenched by impressing on the superconducting loop a magnetic field above critical value which destroys superconduction thereby restoring finite resistance and abruptly attenuating the persistent current, and it is an object of the present invention to provide a novel persistent current device which may be readily quenched.

According to the invention an electrical device comprises a loop of superconductive material responsive to a magnetic field to change between a superconducting state and a state of finite resistance, means for applying to the loop a first magnetic field whose lines of force are oriented to establish persistent current in the loop, and means for applying to the loop a second magnetic field whose lines of force are oriented so as to be incapable of establishing current in the loop thereby to quench said persistent current.

For the purpose of illustration typical embodiments of the invention are shown in the accompanying drawing in which.

Figure 1:
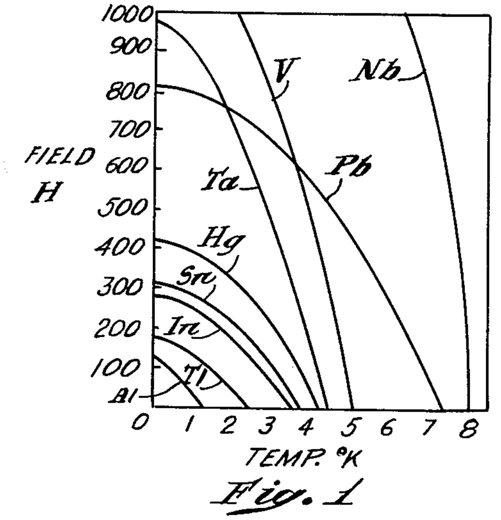
FIG. 1 is a plot of transition temperature against magnetic field applied to several superconductive elements.

As shown in FIG. 1 various elements are capable of superconduction, depending upon the temperature and magnetic field of their environment. In this figure are shown the transition curves of aluminum (Al), thallium (Tl), indium (In), tin (Sn), mercury (Hg), tantalum (Ta), vanadium (VI), lead (Pb) and niobium (Nb). For each of these elements the curve is a plot of the transition temperature as a function of the applied magnetic field. Below the curve the element is superconducting, and above the curve the element has a finite resistance usually less than the resistance at room temperature.

Figure 2:
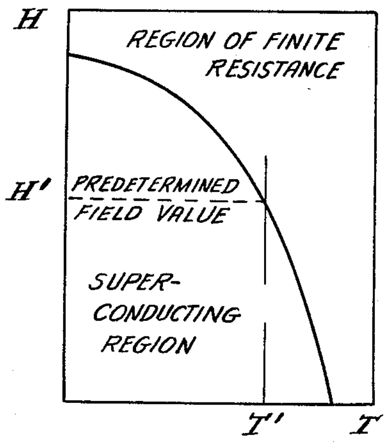
FIG. 2 is a similar plot illustrating transition of a superconductive body between states.

As shown in FIG. 2 the transition curve is the boundary between the superconducting region and finite resistance region of a given element. For a given temperature environment T' there is a predetermined magnetic field value H' at the transition point or zone. Increasing the field above the predetermined value H' destroys superconduction, while reducing the field below the predetermined value establishes superconduction.

Figure 3:
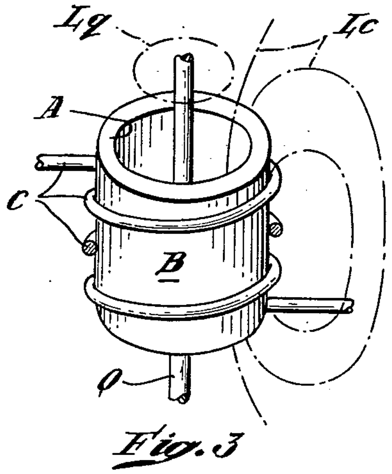
FIGS. 3 to 5 are isometric views of different forms of the device.

In FIG. 3 the device is in the form of an annular body B of superconductive material maintained below critical temperature, for example, by immersion in liquid helium at 4.2° K.

Wound around the body B and insulated therefrom is a control coil C. Extending coaxially through the annular body is a quenching conductor Q. Current through the control coil C will produce a magnetic field designated by lines of force $Lc$ in planes intersecting the loop B. Current in the quenching conductor Q produces a field whose lines of force $Lq$ are coaxial with the annular body B, and since this body is equivalent to a series of adjacent loops, the lines $Lq$ may be said to be in planes parallel to the plane of each loop of the body.

Because the lines of force $Lc$ of the coil C cut the conducting loop formed by the superconductive body B, current will be established in the loop whenever the magnetic field $Lc$ is changed by variation of current in the control winding C, and if the body B is in a superconductive state of zero resistance the current established will persist indefinitely.

According to the invention an existing persistent current is quenched by current in a conductor Q which sets up a magnetic field having lines of force $Lq$ in planes parallel to the loop formed by the superconducting body B. A current in the conductor Q high relative to the inducing current in coil C will produce a field sufficient to change the body from superconductive to finite resistance state and attenuate the persistent current to zero. Superconduction may be destroyed by such a field regardless of its orientation. However, neither applying nor cutting off current to the quenching conductor Q will tend to establish current in the loop B, probably for the reason that the magnetic lines of force $Lq$ of the conductor Q encircle the conductor in planes parallel to the loop, and thus the lines of force do not cut the loop when the field is expanding or collapsing. In any case, the field $Lq$ will quench persistent current established by the coil C after current is supplied to or cut off from the coil.

A typical establishing-quenching sequence is as follows. Sufficient current is supplied to the control coil C to establish a field above the predetermined transition value. The body then has finite resistance and current cannot persist. If the control current is cut off or reduced so as to bring the field below predetermined value, the body B will be superconducting and the collapsing field will establish persistent current as described above. When current is supplied to the coil Q, raising the field above predetermined value, the persistent current is then quenched.

In an alternative establishing-quenching sequence, current is supplied to the coil C below the value necessary to destroy superconduction and a persistent current is established. Current now supplied to the conductor Q will destroy superconduction in the loop B and quench the persistent current. Now if current is cut off from the conductor Q superconduction will be restored, but not persistent current. Then if current is cut off from coil C, its collapsing field will establish persistent current in the loop B, and it will be unnecessary to maintain current either in the inducing coil C or the quenching conductor Q while the current persists. To quench the established persistent current, sufficient current is supplied to the quenching conductor Q to produce a field destructive of superconduction in the loop B. Thus the quenching conductor may be employed both in establishing and quenching persistent current.

Figures 4, 6:
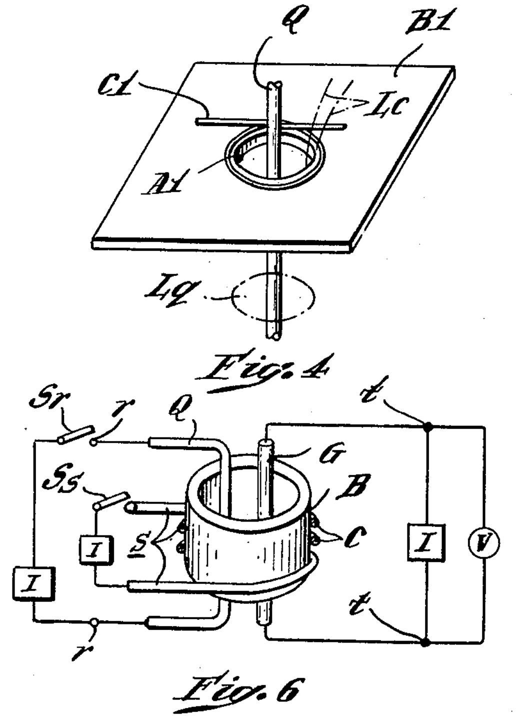
FIGS. 6 to 8 are schematic diagrams of memory units embodying the present invention.

The loop may take various other forms, one of which is shown in FIG. 4, wherein a plate B1 of superconductive material has a circular aperture A1. Around the aperture A1, the plate forms a closed loop in which persistent current may flow. Persistent current is established by a coil C1 above and parallel to the plate B1, and is quenched by the field L*q* in a conductor Q as in the example of FIG. 3.

Figure 5:
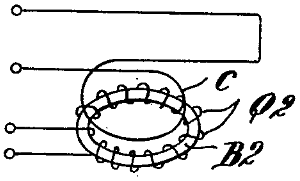

In FIG. 5 a toroid form of superconductive loop B2 is shown. The quenching conductor Q2 is wound in the form of a hollow torus enclosing the toroid loop so that the lines of force produced by the conductor Q2 exist mainly within the torus. Persistent current is established in the toroid loop B2 by a control coil C like that of FIGS. 3 and 4 and of diameter approximately the same as the loop.

An application of the invention as an element in a memory matrix is illustrated schematically in FIG. 6. Herein the superconductive loop B, control coil C and quenching conductor Q are like corresponding parts of FIG. 3, although the forms of FIGS. 4 and 5 may be used. The control coil has input or set terminals *s* to which a momentary current for establishing persistent current is supplied by a current source I and set switch S*s*. A bit of information may be stored in the loop B by applying such current. The bit may be cancelled by applying quenching current to reset terminals *r* on the quenching conductor Q by means of a current supply I and reset switch S*r*. When a bit is stored in the loop as persistent current a fixed magnetic field extends through the loop B as previously explained. A gate G of superconductive material disposed in the fixed field will have its superconductivity destroyed so long as current persists in the loop. In this state the gate G will offer a finite resistance to a current source I connected to its readout terminals *t*, which resistance is indicated on a voltmeter V also connected across the gate. However, if persistent current in the loop B is quenched by current through the reset terminals *r*, the gate G is restored to superconducting state in which it presents no resistance to current applied through the readout terminals *t*, which zero resistance is indicated by the meter V.

Preferably but not necessarily the control windings C and C1 and the quenching conductors Q and Q2 of FIGS. 3 to 6 are of superconductive material having higher critical field values than the respective loops B, B1 and B2 so that they remain superconducting in the operating fields for the loop and thus reduce operating resistance. For example, at a given temperature niobium remains superconducting in fields well above the critical fields for lead (Pb) and tantalum (Ta), as shown in FIG. 1.

Typical materials and dimensions of the form of FIG. 3 are as follows. The annular body B is of tantalum with an enamel insulating coating and has an outside diameter of 0.03 inch, wall thickness of 0.002 inch, and length 0.5 inch. The control coil C is a niobium wire 0.003 inch in diameter, having 100 turns, closely wound. The quenching conductor Q is a niobium wire, 0.009 inch in diameter, or several turns of .003 inch niobium wire.

Like materials and dimensions may be used for the coil C1 and quenching conductor Q of FIG. 4. The plate B1 may be of tantalum 0.009 inch thick and form one or more openings 0.1 inch in diameter.

In FIG. 5 a tantalum torus B2 .25 inch in loop diameter and 0.03 thickness may be used. The loop diameter of the niobium coil C is of the same order as the torus and its wire diameter may be 0.003 inch. A niobium quenching winding 0.003 inch in wire diameter is wound directly on the torus B2 after a thin insulating coat has been applied thereto.

Materials and dimensions for the loop B, coil C and conductor Q of FIG. 6 may be like that of FIG. 3; i.e. tantalum loop B and niobium wires C and Q. The gate G is preferably a superconductor having a characteristic curve being within that of the loop B, for example, tin (Sn) or indium (In). The gate G may have a wire diameter of 0.009 inch.

A memory device equivalent to that of FIG. 6 may be made by evaporating annular shells of a tantalum gate and lead loop on a 0.03 niobium quenching wire, with intermediate insulating coats. Similarly the control coil C may be evaporated on an insulating coating over the outer shell.

Figure 7:
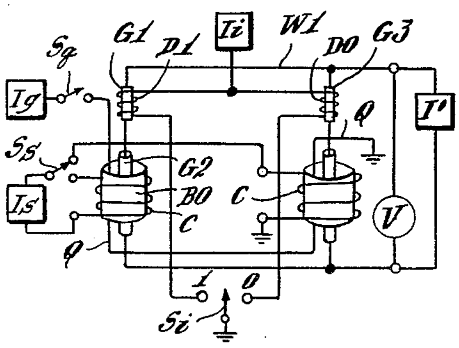

In FIG. 7 is shown a memory circuit capable of responding to interrogation. This unit comprises a primary source of current I′ which supplies current through a current supply bus W1, and thence through two alternative paths to a current collecting bus W2. One path includes superconducting gates G1 and G2, and the other includes gates G3 and G4. Gates G2 and G4 form parts of the memory elements previously described and are located within superconductive loops B0 and B1. A quenching conductor Q extends from a current source I*g* and switch S*g* through both loops to a ground return. Control coils C for the respective loops are alternatively connected to a current supply I*s* by means of a switch S*s* which, as previously explained may set up a persistent current in either loop B0 or B1. When one of the loops is carrying persistent current, the gate G2 or G4 within it is held in resistive state. Thus either a bit 0 or a bit 1 may be stored in the circuit by establishing persistent current respectively in loop B0 or B1. Such bits may be erased by applying quenching current to the quenching conductor Q.

To interrogate the circuit a momentary current is applied to one of two control coils D1 or D0 respectively for gates G1 or G3. The controls are connected between a current supply I*i* and an interrogation switch S*i*. Current through a control coil establishes a magnetic field destroying superconduction in its respective gate and causing it to be resistive. If, for example, the bit 0 is stored in the circuit in the form of persistent current in loop B0, gate G2 establishes a finite resistance in the current path therethrough. Then if the circuit is asked if 0 is stored, by throwing switch S*i* to its 0 position, gate G3 will establish a finite resistance in the alternative path therethrough. Whereas previously the path through gates G3 and G4 offered zero resistance, a voltmeter V connected to the buses W1 and W2 across the two paths will now measure a finite resistance in both paths, indicating that bit 0 is stored in the memory.

On the other hand, if the memory is asked if bit 1 is stored therein by throwing the interrogation switch to its 1 position, gate G1 is made resistive, but gates G3 and and G4 remain superconducting and the voltmeter V is not deflected. However, if bit 1 had been stored the resistance of both gate G1 and G4 would be measured by the voltmeter.

Figure 8:
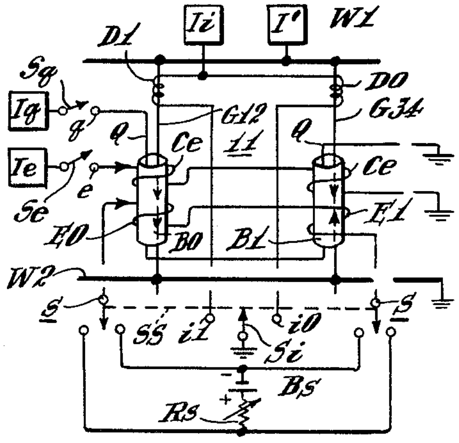
Figure 9:
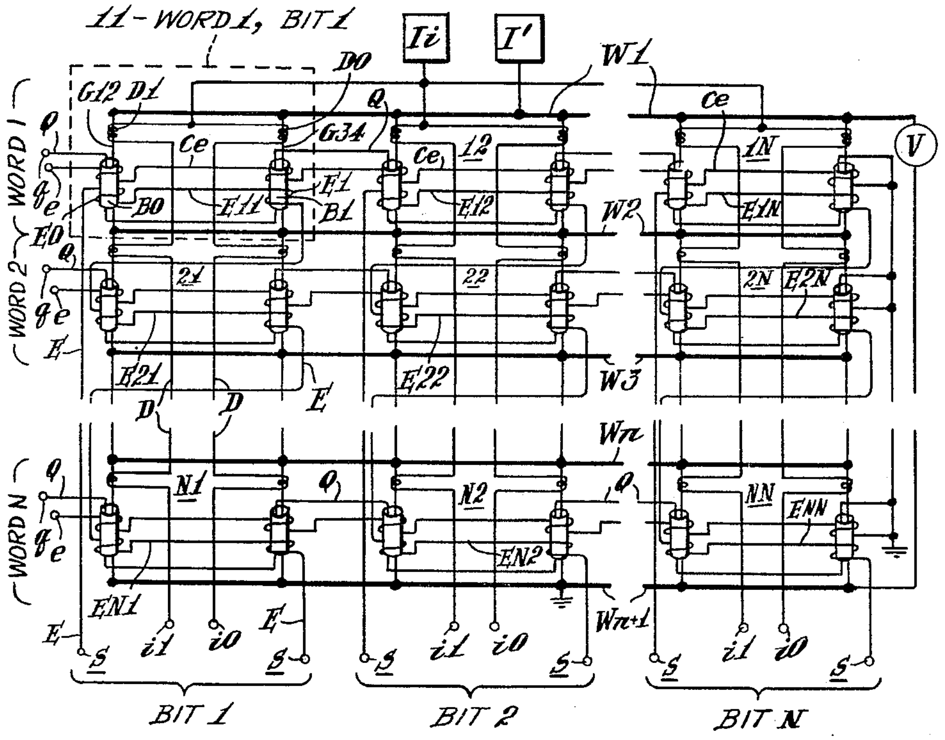
FIG. 9 is a schematic diagram of a multi-unit memory.

As shown in FIGS. 8 and 9 such a memory circuit is particularly well adapted as one unit or location in a large memory matrix. FIG. 9 shows a matrix a plurality of units or locations arranged in parallel series. Each horizontal series of locations represents a numerical word having N digits. The top series or word 1 includes locations 11, 12 to 1N, the second series or word 2 includes locations 21, 22 to 2N, and so on to the last series, word N, of locations N1, N2 to NN.

The circuit for each location is shown in FIG. 8, which like FIG. 7 comprises a primary current source I′, current-supply and collection means W1 and W2, superconductive loops B0 and B1 and a quenching circuit including current source *Ig*, switch *Sg*, terminal *g* and conductor Q. In the location of FIG. 8 the interrogation gate and memory gate (G1 and G2 in FIG. 7) are formed by one superconductive tantalum wire G12 or G34 which is connected between the buses W1 and W2. Persistent current is established in one of the loops B0 or B1 by the combined fields of enable coils *Ce* and set or writing coils E0 or E1. The enable coils *Ce* are supplied with current from a current source *Ie* through a switching means *Se* and terminal *e*. The set coils E0 and E1 are supplied with current from a voltage source B*s* and variable series resistance R*s* through a double throw set switch S*s* and terminals *s*. The voltage source B*s* and resistance R*s* comprises a typical constant current supply having high resistance (R*s*) compared to the superconductive elements connected thereto. The set coils E0 and E1 are wound oppositely on the respective loops B0 and B1 so that the polarity of the magnetic fields through the coils are opposite.

For example, if enable current is supplied to coils *Ce* as shown by arrowheads in FIG. 8, the magnetic field of both coils will be polarized downward as shown by broken arrows. Then if the set switch S*s* is swung left to supply current to the set coils E0 and E1 as indicated by arrowheads, the field of set coil E0 will be polarized downward and that of coil E1 will be polarized upward. The fields of coil E0 will add to the adjacent enable coil *Ce* to produce a field sufficient to establish persistent current in loop B0, while the field of coil E1 will oppose that of the adjacent coil *Ce* and the composite field will be insufficient to establish persistent current. If it were desired to set the bit 1 in loop B1, the set switch S*s* would be thrown to the left. Whichever bit is set in the location may be erased by supplying current to the quenching conductor Q as previously described.

Each of the locations in FIG. 9, such as location 11 enclosed by a broken line, is equivalent to the unit of FIG. 8. The locations 11, 12 to 1N of word 1 share a common current-supply bus W1 and a common current-collecting bus W2. Bus W2 serves as current-supply means for locations 21, 22 to 2N of word 2, and so on to the current-supply bus W*n* and current-collecting bus *Wn*+1 of word N. Preferably the gates G12 and G34 for the several locations are single length of 0.0009 inch tantalum wire extending from the first bus W1 to the last bus *Wn*+1, and connected to these and the intermediate buses by welds which are non-resistive in the operating temperature range, usually the boiling point of liquid helium, 4.2° K. Throughout FIG. 9, welds are indicated by heavy dots at the intersections of the various conductors.

The quenching conductor Q is shown extending through all the loops of a word to a common ground return to the quenching current supply I*q*, although the conductor Q can be wired through the loops of all the words. As shown a single word may be erased by applying current to the appropriate terminal *q*.

Similarly all the enable coils of a word are formed in series from one continuous wire C*e*, preferably 0.009 inch niobium, although non-superconductive wire may be used. Likewise the write or set coils E0 and E1 of each location of a word are connected in series with the set coils in the same bit location in the other words, and are formed of a single wire E11, E21, EN1, continuous with portions E leading to set terminals *s*.

To write a series of bits in a word, enable current is supplied to the enable terminal *e* of the word. Simultaneously current is applied to the set terminals *s* for vertical locations, e.g. 11, 21 to N1, the direction of current flow being selected as shown in FIG. 8 to set a 0 bit or 1 bit. The selected bit will be written only in the word supplied with enable current, since only in that word, will the enable and set currents apply reinforcing magnetic fields to one of the loops B0 or B1. The pairs of terminals *s*—*s* for each bit may be supplied with write current either successively, to write a word bit by bit, or simultaneously to write a whole word at once. When a word is stored, current is removed from its enable terminal *e* and supplied to the enable terminal of another word. Information is thus stored word by word until one loop, B0 or B1, of each location carries persistent current, and correspondingly one gate G12 or G34 is held in resistive state.

All the words of the memory matrix of FIG. 9 may be interrogated simultaneously by means of the interrogate coils D0 or D1 in each location. For each vertical series of bit locations, e.g. 11, 21 to N1, the respective interrogate coils D0 or D1 are formed in series by a single conductor D extending respectively to the interrogate terminals *i1* or *i0*. Current supplied to one terminal of a set will inquire whether the bit 0 or 1 is stored in the corresponding location of any of the words.

For example, suppose that the words 100, 110 and 111 are stored in the memory of FIG. 9 by holding in resistance state the gates indicated in the table below; and that the memory is asked first whether the word 000 is in the memory, and second, whether word 100 is present:

| | Bit 1 | | Bit 2 | | Bit 3 | |
|---|---|---|---|---|---|---|
| | G12 | G34 | G12 | G34 | G12 | G34 |
| Word 1 | ------ | 1 | 0 | ------ | 0 | ------ |
| Word 2 | ------ | 1 | ------ | 1 | 0 | ------ |
| Word 3 | ------ | 1 | ------ | 1 | ------ | 1 |
| 1st Int. | ------ | 0 | ------ | 0 | ------ | 0 |
| 2nd Int. | 1 | ------ | ------ | 0 | ------ | 0 |

On the first interrogation (1st Int.) all the gates of word 1 will be resistive except gate G12 of bit 1; the gates of word 2 will be resistive except gates G12 of bits 1 and 2; and none of the gates G12 of word 3 will be resistive. Thus through each word a zero resistance path exists between the bus bars W1 and *Wn*+1. A voltmeter V connected between these bus bars will indicate, by failing to change its deflection, that the word 000 is not stored in the memory.

On the second interrogation (2nd Int.) all the gates G12 and G34 of word 1 will be held in resistive state either by the loops B0 and B1 or by the interrogate coils D0 and D1. Thus between bus bars W1 and W2 there exists a finite resistance which, when measured by the voltmeter V, causes a deflection of the meter indicating that the word 100 is present in the memory.

Preferably the memory is mounted on a thin phenolic board in a configuration much like the circuit of FIG. 9. A number of boards may be stacked to extend the number of words and bits. Preferably the various conductors W1 to WN, C*e*, D and E are 0.009 inch niobium wire, as are the conductors between boards. When assembled the boards are placed in a double-dewar, i.e. vacuum jacketed vessel, containing liquid helium, which in turn is placed in a similar double-dewar containing liquid nitrogen.

While the magnitude of the IR drop through the several parallel paths of word 1 may be very small if the word is long, the IR drop may be amplified in a vacuum tube voltmeter without the usual problems of electrical and thermal noise. At the boiling point of helium, 4.2° K., thermal activity is negligible compared to that under normal room conditions, and double-dewar vessels in which the memory is immersed provide nearly perfect electromagnetic shielding. Care must be taken, however, to insure that the welds are carefully formed.

It should be understood that the various embodiments of the invention have been described for the purpose of illustration only, and that the invention includes all modifications and equivalents which fall within the scope of the appended claims.

I claim:

1. An electrical memory comprising current-supply means and current-collection means, superconductive means forming at least two paths between said current means, each path including superconductive gate means, a closed loop of superconductive material embracing each gate means, means for applying to the loop a first magnetic field whose lines of force are oriented to establish persistent current in the loop, means for applying to the loop a second magnetic field whose lines of force are oriented so as to be incapable of establishing current in the loop thereby to quench said persistent current, and for each path, control means for applying a magnetic field to gate means therein so as to influence a change of the gate means to resistive state, whereby the paths may be made resistive by persistent current in the said loops or by current applied to one of said control means.

2. An electrical memory comprising current-supply means and current-collection means, superconductive means forming at least one pair of alternative paths between said current means, said superconductive means being responsive to a magnetic field to change between a superconducting state and a state of finite resistance, a pair of closed loops of superconductive material embracing respective paths of a pair, means for establishing persistent current in one loop of a pair thereby to apply a magnetic field to the path and hold the path in a state of finite resistance, and, for each path of a pair, control means for applying a magnetic field thereto so as to influence a change of the path to finite resistance state, whereby when current is applied to a loop of one path and the control means of the other path of a pair, the superconductive means in both paths change to a state of finite resistance.

3. An electrical memory comprising current-supply means and current-collection means, superconductive means forming at least two paths between said current means, each path including superconductive gate means, a closed loop of superconductive material embracing each gate means, means for applying to the loop a first magnetic field whose lines of force are oriented to establish persistent current in the loop, the establishing means for each loop including first and second inductive means, the first means for the loop of one path being polarized oppositely to the first means for the loop of another path, means for applying to the loop a second magnetic field whose lines of force are oriented so as to be incapable of establishing current in the loop thereby to quench said persistent current, and for each path, control means for applying a magnetic field to gate means therein so as to influence a change of the gate means to resistive state, whereby the paths may be made resistive by persistent current in the said loops or by current applied to one of said control means.

4. An electrical memory comprising current-supply means and current-collection means, superconductive means forming a plurality of pairs of alternative paths between said current means, said superconductive means being responsive to a magnetic field to change between a superconducting state and a state of finite resistance, a pair of closed loops of superconductive material embracing respective paths of each pair, means for establishing persistent current in one loop of a pair thereby to apply a magnetic field to the path and hold the path in a state of finite resistance, said establishing means including a magnetic inductive means for each of said loops, the inductive means being connected in series, and for each path of a pair control means for applying a magnetic field thereto so as to influence a change of the path to finite resistance state, whereby when current is applied to a loop of one path and the control means of the other path of a pair, the superconductive means in both paths change to a state of finite resistance.

5. An electrical memory comprising current-supply means and current-collection means, superconductive means forming at least two paths between said current means, each path including superconductive gate means, a closed loop of superconductive material embracing each gate means, means for applying to the loop a first magnetic field whose lines of force are oriented to establish persistent current in the loop, means for applying to the loops in said paths a second magnetic field whose lines of force are oriented so as to be incapable of establishing current in the loop thereby to quench said persistent current, the last said means being connected in series so that the loops in said paths may be quenched simultaneously, and for each path, control means for applying a magnetic field to gate means therein so as to influence a change of the gate means to resistive state, whereby the paths may be made resistive by persistent current in the said loops or by current applied to one of said control means.

6. An electrical memory comprising current-supply means and current-collection means, superconductive means forming a plurality of pairs of alternative paths between said current means, said superconductive means being responsive to a magnetic field to change between a superconducting state and a state of finite resistance, a pair of closed loops of superconductive material embracing respective paths of a pair, means for establishing persistent current in one loop of a pair thereby to apply a magnetic field to the path and hold the path in a state of finite resistance, for each path of a pair control means for applying a magnetic field thereto so as to influence a change of the path to finite resistance state, whereby when current is applied to a loop of one path and the control means of the other path of a pair, the superconductive means in both paths change to a state of finite resistance, and means for applying to each loop a magnetic field whose lines of force are oriented so as to be incapable of establishing current in the loop, thereby to quench persistent current in said loop, the last said means being connected in series, whereby the loops in said plurality of paths may be quenched simultaneously.

References Cited by the Examiner

UNITED STATES PATENTS

| | | | |
|---|---|---|---|
| 2,832,897 | 4/58 | Buck | 340—173 X |
| 2,913,881 | 11/59 | Garwin | 340—173 |

OTHER REFERENCES

"The Cryotron—A Superconductive Computer Element," D. A. Buck, Proceedings of the IRE, April 1956, pages 482–493.

Publication II: "A Cryotron Catalog Memory System" by Slade and McMahon.

Proceedings of the Eastern Joint Computer Conference, December 10–12, 1956, pp. 115–120.

"Superconductivity," by C. W. Hewlett, General Electric Review, June 1946, pp. 19–25.

IRVING L. SRAGOW, *Primary Examiner.*

EVERETT R. REYNOLDS, STEPHEN W. CAPELLI, *Examiners.*